United States Patent
Komada

(10) Patent No.: US 10,203,372 B2
(45) Date of Patent: Feb. 12, 2019

(54) FUEL CELL POWERED VEHICLE TESTING SYSTEM AND METHOD THEREOF

(71) Applicant: HORIBA, Ltd., Kyoto (JP)

(72) Inventor: Mineyuki Komada, Kyoto (JP)

(73) Assignee: Horiba Ltd., Kyoto (JP)

( * ) Notice: Subject to any disclaimer, the term of this patent is extended or adjusted under 35 U.S.C. 154(b) by 21 days.

(21) Appl. No.: 15/360,186

(22) Filed: Nov. 23, 2016

(65) Prior Publication Data

US 2017/0168116 A1 Jun. 15, 2017

(30) Foreign Application Priority Data

Dec. 15, 2015 (JP) ................................. 2015-244095

(51) Int. Cl.
*G01R 31/34* (2006.01)
*B60L 11/18* (2006.01)
*H01M 8/04298* (2016.01)
*G01M 17/007* (2006.01)

(52) U.S. Cl.
CPC ........ *G01R 31/343* (2013.01); *B60L 11/1881* (2013.01); *G01M 17/007* (2013.01); *H01M 8/04305* (2013.01); *H01M 2250/20* (2013.01); *Y02T 90/32* (2013.01)

(58) Field of Classification Search
CPC ............ G01R 31/343; H01M 2250/20; H01M 8/04305; G01M 17/007; B60L 11/1881
USPC ........ 324/765.01, 500, 761.01, 76.11, 76.37, 324/750.3, 425–450
See application file for complete search history.

(56) References Cited

U.S. PATENT DOCUMENTS

| 9,383,398 | B2 * | 7/2016 | Choi | G01R 31/00 |
| 2015/0066260 | A1 * | 3/2015 | Butcher | B60L 15/2045 701/22 |
| 2016/0308484 | A1 * | 10/2016 | Engstrom | H02P 29/005 |

FOREIGN PATENT DOCUMENTS

JP 2001-091410 A 4/2001

OTHER PUBLICATIONS

EESR dated May 17, 2017 issued for European patent application No. 16 199 834.9, 7 pgs.
Jin Zhenhua et al., Integration of Fuel Cell Hybrid Powertrain Based on Dynamic Testbed, Vehicle Power and Propulsion Conference, Sep. 3, 2008, pp. 1-5.
Schupbach R. M. et al., A Versatile Laboratory Test Bench for Developing Powertrains of Electric Vehicles, Vehicular Technology Conference Proceedings, Sep. 24, 2002, vol. 3, pp. 1666-1670.

* cited by examiner

*Primary Examiner* — Melissa J Koval
*Assistant Examiner* — Trung Nguyen
(74) *Attorney, Agent, or Firm* — Brooks Kushman P.C.

(57) ABSTRACT

In order to provide a fuel cell powered vehicle testing system capable of performing a test of a power system of a fuel cell powered vehicle by a simpler facility, includes: a dynamometer which is connected to an output shaft of an electric motor mounted on a fuel cell powered vehicle for applying a simulation travelling load to the electric motor; and a supply power simulator adapted to simulate an operation of the fuel cell mounted on the fuel cell powered vehicle and to apply power to the electric motor, the power being to be supplied from the fuel cell to the electric motor.

7 Claims, 4 Drawing Sheets

FUEL CELL POWERED VEHICLE TESTING SYSTEM AND METHOD THEREOF

CROSS-REFERENCE TO RELATED APPLICATIONS

This application claims priority to JP Application No. 2015-244095, filed Dec. 15, 2015, the disclosure of which is incorporated in its entirety by reference herein.

TECHNICAL FIELD

The present invention relates to a fuel cell powered vehicle testing system and the like performing a test for evaluation and the like of a fuel cell powered vehicle, and in particular to those suitably used in testing a power system of a fuel cell powered vehicle.

BACKGROUND ART

Conventionally, as disclosed in, e.g., Patent Literature 1, there has been known a system for testing a power system in a single unit in order to identify performance of the power system before installation in a fuel cell powered vehicle and evaluate the power system in a process of development. In this Patent Literature 1, disclosed is a configuration of performing an evaluation test of the power system while the power system of the fuel cell powered vehicle is connected to a dynamo (here, noting that the power system includes an electric motor and a control device thereof). In this configuration, an actual fuel cell and auxiliary battery are connected to the electric motor in order to supply power and store regenerative power.

However, in this conventional system mentioned above, since the actual fuel cell is used, it is necessary to provide a high-pressure hydrogen tank or the like and there arises a problem of safety and the like relating to handling thereof. Therefore, surrounding facilities become large-scaled and it takes a great deal of time and effort to set-up for securing the safety.

Further, since a status of a fuel cell is changed by being affected by temperature, humidity, hydrogen pressure and the like, it is difficult to perform a repetitive test under the same condition and it is likely not to be able to achieve development and specify a defect smoothly.

CITATION LIST

Patent Literature

Patent Literature 1: JP2001-091410A

SUMMARY OF INVENTION

Technical Problem

Therefore, the present invention has been intended to be able to perform a test in a unit of a power system of a fuel cell powered vehicle more simply and safely and yet with high reliability.

Solution to Problem

That is, in one aspect of the present invention, a fuel cell powered vehicle testing system according to the present invention, includes: a dynamometer which is connected to an output shaft of an electric motor mounted on a fuel cell powered vehicle and which is adapted to apply a simulation travelling load to the electric motor; and a supply power simulator adapted to simulate an operation of the fuel cell mounted on the fuel cell powered vehicle and to apply power to the electric motor, the power being to be supplied from the fuel cell to the electric motor.

Further, in another aspect of the present invention, a fuel cell powered vehicle testing method according to the present invention, includes: applying a simulation travelling load to an electric motor mounted on a fuel cell powered vehicle; and simulating an operation of the fuel cell mounted on the fuel cell powered vehicle and applying power to the electric motor, the power being to be supplied from the fuel cell to the electric motor.

With this arrangement, when testing a power system of a fuel cell powered vehicle, since a fuel cell becomes unnecessary and a high-pressure hydrogen tank and the like is accordingly unnecessary, it becomes possible to perform a test more safely by a simple facility. Moreover, since a simulation fuel cell is used, there is no unexpected varying factor such as an actual fuel cell and therefore it becomes possible to perform a test with high reliability of repetition.

In some cases, an auxiliary battery is mounted on a fuel cell powered vehicle for assisting the fuel cell. In the case where the supply power simulator has a function of simulating an operation of the auxiliary battery, it is possible to perform a test having higher simplicity and reliability of repetition.

As a specific embodiment, there can be exemplified such that the supply power simulator is configured to be switched according to a test situation between a case of simulating an operation of the fuel cell and a case of simulating an operation of the auxiliary battery. More preferably, there can be exemplified such that the supply power simulator is configured to be switched according to a test situation also in the case of simultaneously simulating the operations of both the fuel cell and the auxiliary battery.

For example, in order to contribute to user's convenience of development, etc., of a fuel cell powered vehicle as uniquely given to a user of a vehicle maker and the like, the supply power simulator is preferably configured to further include a main control device adapted to control the fuel cell based on at least traveling data relating to an accelerator opening degree and a brake pedal pressing degree, etc., and that the control sequence data of the main control device can be rewritten by a user.

Advantageous Effects of Invention

According to this arrangement, it becomes possible not only to perform a test of a power system of a fuel cell powered vehicle simply and safety but also to improve reliability of repetition of the test.

DESCRIPTION OF EMBODIMENTS

The following describes one embodiment of the present invention with reference to the accompanying drawings.

Figure 1:
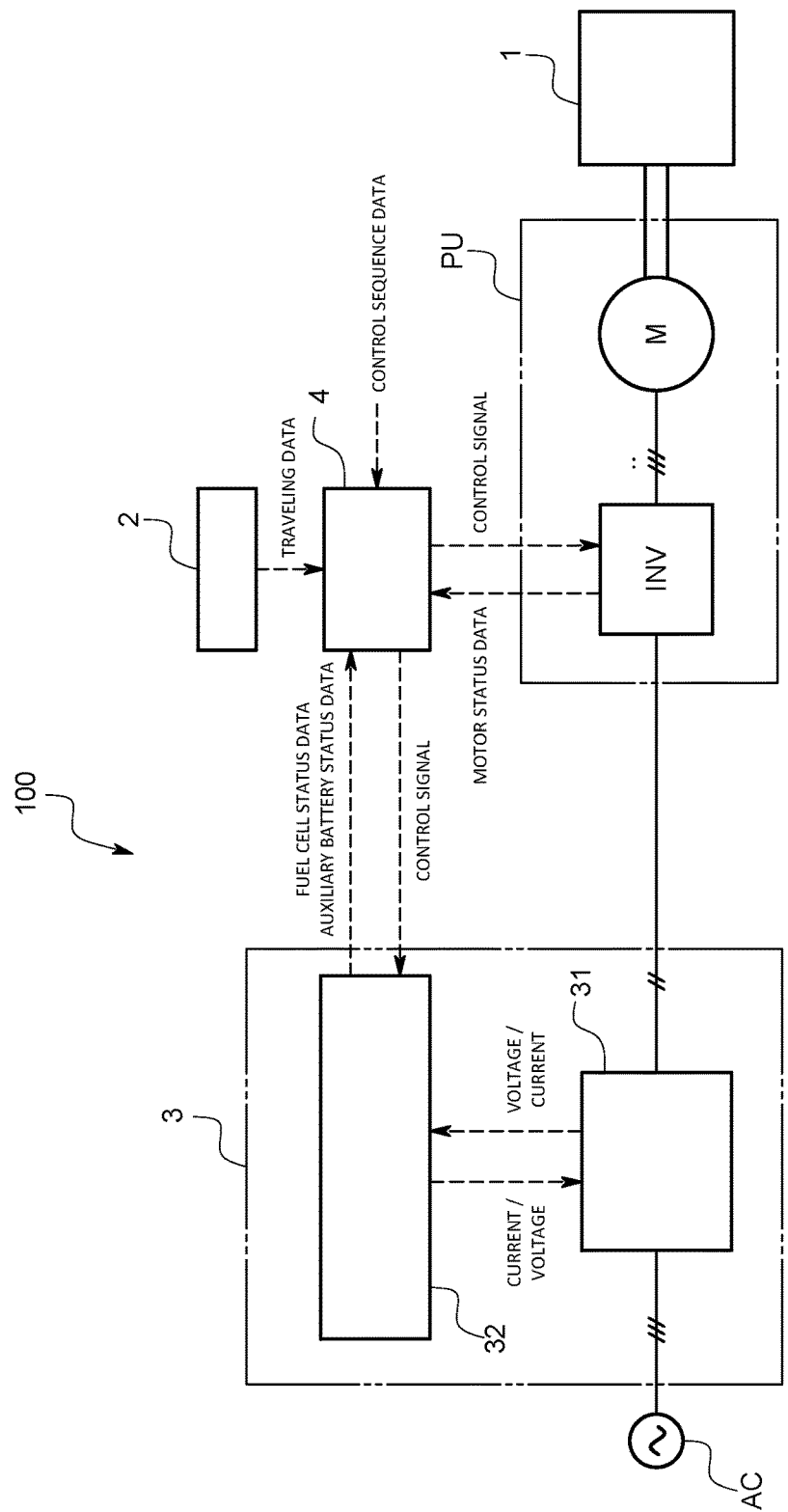
FIG. 1 is an entire schematic diagram showing a fuel cell powered vehicle testing system in one embodiment of the present invention.

A fuel cell powered vehicle testing system 100 according to the present embodiment is intended to test a power system PU of a fuel cell powered vehicle in a single unit. As shown in FIG. 1, the fuel cell powered vehicle testing system 100 includes: a dynamometer 1; a traveling data applying device 2; a main control device 4; and a supply power simulator 3.

In this description, the power system means a concept of including a traveling electric motor M (simply referred to as "electric motor M" hereinafter) to be mounted on the fuel cell powered vehicle and an inverter type motor drive control device INV (simply referred to as "motor drive control device INV" hereinafter) for drive-controlling the electric motor M.

Next, respective parts of the fuel cell powered vehicle testing system 100 are described as follows.

The dynamometer 1 is intended to apply a load or a driving force acting in traveling on a road to an output shaft S of the electric motor M. Specifically, although not shown, this dynamometer 1 includes a flywheel which reproduces an inertial force generated by such as weight of a vehicle and an electric motor and a control device thereof for reproducing such as a resistance when traveling on a road. Herein, for example, equivalents to those used in an engine vehicle are used.

The traveling data applying device 2 is an information processing unit (computer) including, for example, a CPU, a memory, a communication port. This traveling data applying device 2 stores several driving patterns used in testing, and, for example, in the case where a driving pattern in testing is determined by an operator, the traveling data such as accelerator opening degree data and brake pedal pressing degree data in the determined driving pattern is transmitted to the main control device 4.

Figure 3:
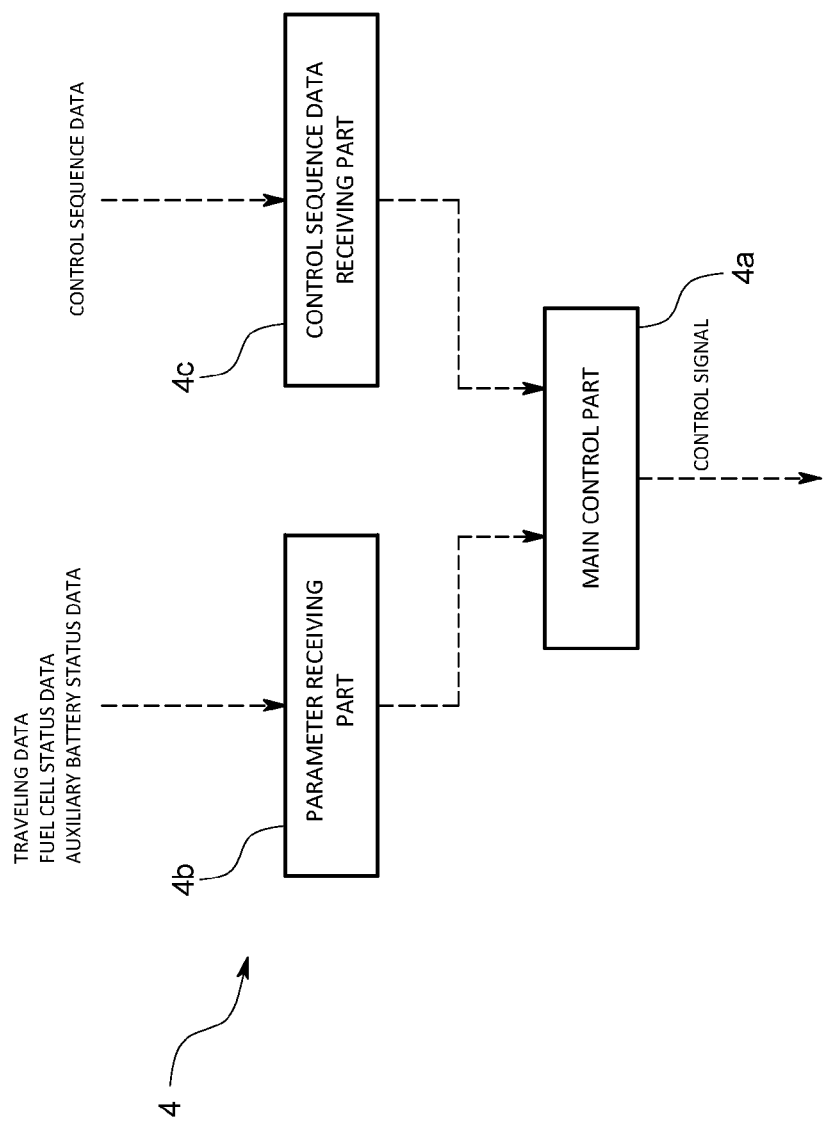
FIG. 3 is a functional block diagram of a main control device in the same embodiment.

The main control device 4 is an information processing unit (computer) including, for example, a CPU, a memory, a communication port. As shown in FIG. 3, the main control device 4 is functionally configured to include: a main control part 4a for controlling the motor drive control device INV, a fuel cell or an auxiliary battery and the like based on various parameters; a parameter receiving part 4b for receiving the parameters; and a control sequence data receiving part 4c for receiving the control sequence data for use in the main control part 4a.

The parameters received by the parameter receiving part 4b includes: the traveling data; motor status data according to motor current and motor rotation speed transmitted from the motor drive control device INV, or fuel cell status data pertaining to a power generation amount, fuel (hydrogen) remaining amount and the like obtained from the fuel cell, and auxiliary battery status data, etc., pertaining to power generation/charge amount, remaining power amount and the like obtained from the auxiliary battery.

The main control part 4a is intended to control the motor drive control device INV, fuel cell and auxiliary battery based on the traveling data, motor status data, fuel cell data, auxiliary battery data and the like. For the motor drive control device INV, the control thereof is performed, for example, by setting the motor drive frequency. Meanwhile, for the fuel cell and the auxiliary battery, control and the like relating to switching such as control of, for example, a hydrogen supply amount, or control and the like relating to switching as to which battery should be used, is performed. Thus, the above control is performed according to the control sequence data stored in the memory.

The control sequence data receiving part 4c is intended to receive the control sequence data as described above. This control sequence data is acquired from communications, a memory card and the like, and it is rewritable. The reason why this control sequence data receiving part 4c is provided, is because the motor drive control and the fuel cell control corresponding to a traveling status and a fuel cell status is different for each user (for example, vehicle maker) and such differentiation thereof is expertise in many cases, and by providing this control sequence data receiving part 4c, the user himself or herself can freely define or modify the control sequence data, thereby allowing the control sequence data to be installed in the main control device 4. Note that, in the present embodiment, the control sequence data is predetermined as a default.

As shown in FIG. 1, the supply power simulator 3 is physically configured as an electric circuit which includes: a DC converter 31 for converting AC current outputted from a commercial AC power supply (AC) to DC current; and a power control device 32 for controlling the DC converter 31 to control the output current and output voltage to be desired values. The supply power simulator 3 is functionally intended to simulate the operation of the fuel cell and auxiliary battery (i.e., secondary battery, for example, chargeable lead storage battery or lithium ion battery) installed in the fuel cell powered vehicle.

In specific, the DC converter 31 is an AC/DC converter (not shown) or an AC/DC converter added with a DC/DC converter and it is configured so as to adjust an output voltage or input/output impedances by timing and the like of e.g. a switching element (not shown).

Figure 2:
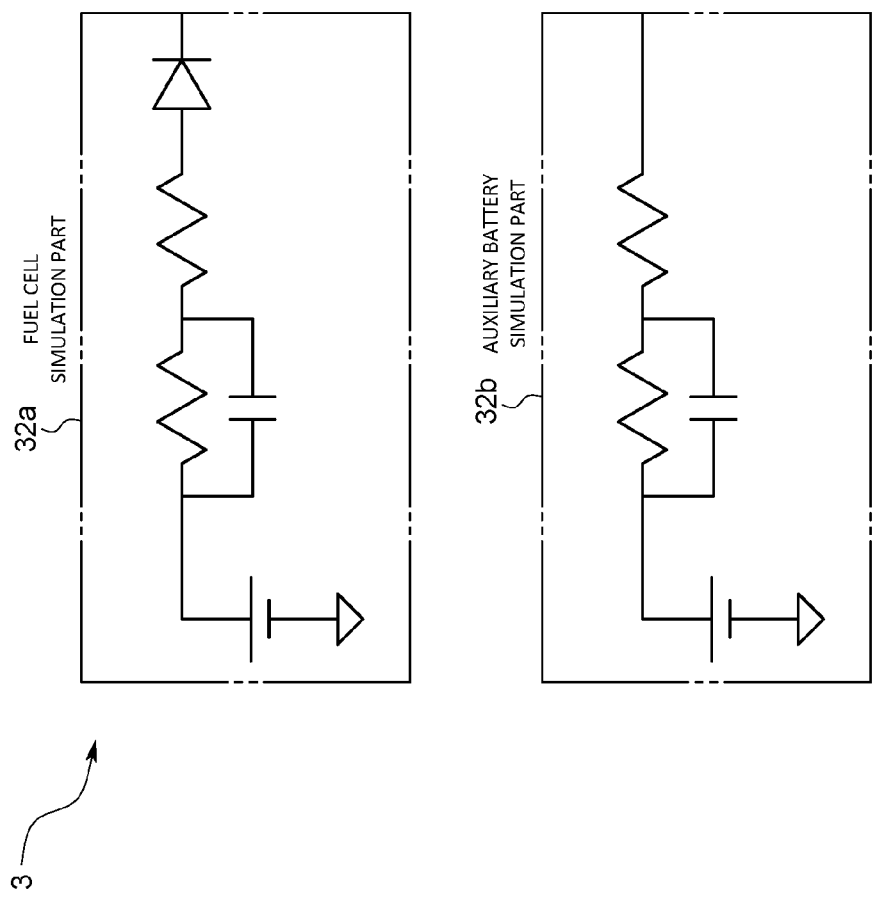
FIG. 2 is an equivalent circuit diagram of a supply power simulator in the same embodiment.

The power control device 32 is an electronic circuit including: a CPU; a memory; an A/D converter; a D/A converter; an input/output port and the like. The power control device 32 is intended to control the DC converter 31 according to a predetermined program stored in the memory, thereby allowing the supply power simulator 3 to exert such as a function of a fuel cell simulation part 32a simulating the operation of the fuel cell and a function of an auxiliary battery simulation part 32b simulating the operation of the auxiliary battery as shown in FIG. 2.

Since the fuel cell simulation part 32a is intended to generate power by a chemical reaction of a fuel cell, it is originally preferable to simulate based on the chemical reaction. However, it takes much time to calculate with the configuration mentioned above and it is likely that real-time property is spoiled. Therefore, in the present embodiment, as shown in FIG. 2, placing importance on calculation speed, the fuel cell simulation part 32a calculates voltage and current values to be outputted by the fuel cell, based on an equivalent circuit substantially equivalent to an actual fuel cell in terms of an internal impedance and responsibility, and it is intended to transmit a command signal to the DC converter 31 so that the DC converter 31 outputs the voltage and current of the calculated values. In this arrangement, the equivalent circuit is previously stored in the memory.

Further, regarding the fact that hydrogen serving as fuel is consumed when the fuel cell is operated, the fuel cell simulation part 32a is configured so as to be able to obtain a hydrogen consumption amount by calculation and also calculate the remaining fuel amount to be outputted. The hydrogen consumption amount is allowed to be calculated, for example, by a calculation as follows:

$$\text{output current} \times \text{time} \times \text{coefficient}.$$

Figure 4:
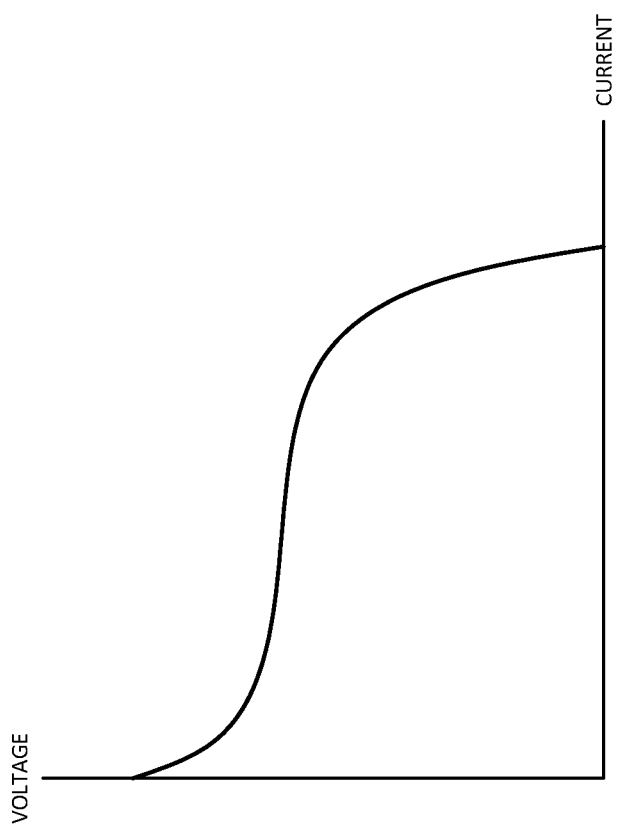
FIG. 4 is a diagram showing an example of an I-V characteristic map of a fuel cell.

Note that, other than the above method using the equivalent circuit, it may be also possible that, for example, the IV characteristic map of the fuel cell as shown in FIG. 4 is previously stored in the memory and the output (current and/or voltage) of the fuel cell is calculated from the IV characteristic map.

Similarly to the fuel cell simulation part 32a, the auxiliary battery simulation part 32b calculates voltage and current values to be outputted by the auxiliary battery, based on an equivalent circuit (shown in FIG. 2) substantially equivalent to an actual auxiliary battery in terms of an internal impedance and responsibility, and it is intended to transmit a command signal to the DC converter 31 so that the DC converter 31 outputs the voltage and current of the calculated values.

Note that, the equivalent circuit is previously stored in the memory. Further, note that, other than the above method using the equivalent circuit, it may be also possible that, for example, the IV characteristic map of the auxiliary battery (not shown) is previously stored in the memory and the output and/or input values of the auxiliary battery can be calculated from this IV characteristic map.

Further, since the auxiliary battery may be also charged with regenerative power from the electric motor M, the auxiliary battery simulation part 32b in this case is also configured so as to be able to control, e.g., the input impedance of the supply power simulator 3 so that the power returning from the electric motor M via the motor drive control device INV becomes the current and voltage values calculated based on the equivalent circuit when the electric motor M is acting as a power generator. At this time, the auxiliary battery simulation part 32b is also intended to calculate and output a charged amount of the auxiliary battery.

Next, the following describes an example of the operation of the fuel cell powered vehicle testing system 100 configured as described above.

Here, the description is made in the case where the fuel cell is used when supplying power to the electric motor M as the control sequence in the fuel cell powered vehicle, and the auxiliary battery is used as an auxiliary power source when charging power regenerated from the electric motor M or when the output of the fuel cell is lowered.

In the case where the main control device 4 determines, based on, such as the traveling data and the motor status data, that the fuel cell powered vehicle is in a testing situation, for example, in an accelerating operation and the like where power is supplied to the electric motor M from the fuel cell in the case of an actual vehicle, the main control device 4 transmits a control signal to the supply power simulator 3 so as to cause the fuel cell to output predetermined voltage.

Then, the fuel cell simulation part 32a receives this control signal and calculates the values of the voltage and current to be outputted based on the equivalent circuit and the like of the fuel cell, thereby allowing these voltage and current to be outputted from the DC converter 31. At this time, since the hydrogen fuel is actually consumed, the fuel cell simulation part 32a obtains the amount of the consumed hydrogen by calculation and also calculates and stores the amount of the remaining fuel, and these calculated amounts are transmitted to the main control device 4.

Further, in this test, in the case where the main control device 4 determines, based on the traveling data and the motor status data, etc., that the fuel cell powered vehicle is in a situation that the electric motor M functions as a power generator to charge the auxiliary battery in the case of an actual vehicle, for example, in a coast traveling when releasing an acceleration pedal, downhill traveling and the like, the main control device 4 stops the output of the fuel cell and generates a control signal so as to allow the auxiliary battery to be charged, and then transmits this control signal to the supply power simulator 3.

Then, while the fuel cell simulation part 32a stops its function, the auxiliary battery simulation part 32b calculates the values of the voltage and current to be charged in the auxiliary battery based on the equivalent circuit of the auxiliary battery and the like. Thus, for example, the input impedance of the supply power simulator 3 is controlled to obtain the current and voltage of the calculated values.

Meanwhile, during this test, in the case where the main control device 4 determines, based on, e.g., the fuel cell status data, that the amount of the remaining hydrogen calculated by the fuel cell simulation part 32a is reduced and the output of the fuel cell is stopped and that the vehicle is in a situation of being driven only by the auxiliary battery in the case of an actual vehicle, the main control device 4 stops the output of the fuel cell and generates a control signal so as to cause the power to be supplied to the motor from the auxiliary battery, thereby transmitting the control signal to the supply power simulator 3.

Then, the fuel cell simulation part 32a stops its operation and the auxiliary battery simulation part 32b allows the voltage and current of the values calculated based on the equivalent circuit of the auxiliary battery and the like to be outputted to the electric motor M or to be inputted from the electric motor M.

Thus, according to such a configuration, when performing a test of the power system PU of the fuel cell powered vehicle, it becomes unnecessary to prepare a fuel cell and also a high-pressure hydrogen tank and the like becomes unnecessary accordingly, and therefore the test can be performed by a simple facility more safely.

Further, since a simulation fuel cell and a simulation auxiliary battery are used, it becomes possible to perform a test with high repetitive reliability without an unforeseen varying factor such as an actual fuel cell and an auxiliary battery. Therefore, the testing system of the present invention can preferably contribute to reduction of time in development of a power system and to solving problems thereof.

Note that the present invention is not limited to the above embodiment. For example, an auxiliary battery simulation part is not always necessary for a supply power simulator, and an actual auxiliary battery may be used.

Furthermore, although any one of the fuel cell simulation part and the auxiliary battery simulation part is selectively allowed to function according to a testing situation in the supply power simulator, it may be also possible to configure so as to operate both of them according to a system of an actual vehicle.

It is not necessary that the travelling data applying device, the main control device and the power control device for the supply power simulator are physically separated, and all of the functions may be implemented by a single computer. Also, while the respective functions are subdivided or a functional unit is made different from the above embodiment, these functions may be implemented by a plurality of computers configured to operate communicatively. Moreover, the program to be installed in a fuel cell powered vehicle testing system may be electronically distributed, or may be stored in a storage medium such as a CD, DVD, HDD, flash memory and the like.

In addition, various modifications and combinations of the present invention may be made without departing from the spirit thereof.

REFERENCE SIGNS LIST

100 . . . Fuel cell powered vehicle testing system
M . . . Electric motor

S . . . Output shaft
1 . . . Dynamometer
3 . . . Supply power simulator
4 . . . Main control device

What is claimed is:

1. A fuel cell powered vehicle testing system comprising:
   a dynamometer, including an electric motor and a control device therefor, connected to an output shaft of an electric motor of a fuel cell powered vehicle and adapted to apply a simulation travelling load that reproduces resistance when travelling to the electric motor of the fuel. cell powered vehicle;
   a main control device adapted to determine and transmit a control signal based on travelling data and motor status data: and
   a supply power simulator adapted to, responsive to the control signal, obtain at least voltage or current values that simulate operation of a fuel cell of the fuel cell powered vehicle, and to apply power to the electric motor of the fuel cell powered vehicle based on the values.

2. The cell powered vehicle testing system according to claim 1, wherein the supply power simulator has a function of simulating an operation. of an auxiliary battery which is installed in the fuel cell powered vehicle for applying auxiliary power to the electric motor of the fuel cell powered vehicle.

3. The fuel cell powered vehicle testing system according to claim 2, wherein the supply power simulator is configured so as to be switched according to a test situation between a case of simulating an operation of the fuel cell and a case of simulating an operation of the auxiliary battery.

4. The fuel cell powered vehicle testing system according to claim 3, wherein the supply power simulator is configured so as to be switched also in a case of simultaneously simulating operations of both of the fuel cell and the auxiliary battery according to a test situation.

5. The fuel cell powered vehicle testing system according to claim 1, wherein the main control device is further adapted to determine and transmit the control signal based on accelerator opening degree, and brake pedal pressing degree, and wherein control sequence data of the main control device is configured so as to be rewritable by a user.

6. A program storage medium storing a program to be installed in a fuel cell powered vehicle testing system comprising a dynamometer, including an electric motor and a control device therefor, connected to an output shaft of an electric motor of a fuel cell powered vehicle and adapted to apply a simulation travelling load that reproduces resistance when travelling to the electric motor of the fuel cell powered vehicle, wherein
   the program storage medium allows a predetermined electric circuit to exert function including:
      determining and transmitting a control signal based. on travelling data and motor status data;
      responsive to the control signal, obtaining at least voltage or current values that simulate operation of a fuel cell to be installed in the fuel cell powered vehicle; and
      applying, power to the electric motor of the fuel cell powered vehicle based. on the value.

7. A fuel cell powered vehicle testing method comprising:
   applying a simulation travelling load that reproduces resistance when travelling to an electric motor of a fuel cell powered vehicle by a dynamometer including an electric motor and a control device therefor, connected to an output shaft of the electric motor of the fuel cell powered vehicle;
   determining and transmitting a control signal based on travelling data and motor status data; responsive to the control signal, obtaining at least voltage or current values that simulate operation of a fuel cell of the fuel cell powered vehicle; and
   applying power to the electric motor of the fuel cell powered vehicle based on the values.

* * * * *